(12) United States Patent
Choi et al.

(10) Patent No.: US 9,469,083 B2
(45) Date of Patent: Oct. 18, 2016

(54) INVERTED NANOCONE STRUCTURES FOR MULTIFUNCTIONAL SURFACE AND ITS FABRICATION PROCESS

(71) Applicant: Massachusetts Institute of Technology, Cambridge, MA (US)

(72) Inventors: Hyungryul Choi, Cambridge, MA (US); Jeong-gil Kim, Cambridge, MA (US); Kyoo Chul Park, Cambridge, MA (US); Robert E. Cohen, Jamaica Plain, MA (US); Gareth H. McKinley, Acton, MA (US); George Barbastathis, Boston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 259 days.

(21) Appl. No.: 13/932,066

(22) Filed: Jul. 1, 2013

(65) Prior Publication Data
US 2014/0010994 A1     Jan. 9, 2014

Related U.S. Application Data

(60) Provisional application No. 61/669,240, filed on Jul. 9, 2012.

(51) Int. Cl.
*B32B 3/30* (2006.01)
*B29C 59/02* (2006.01)
*B29C 33/42* (2006.01)
*G03F 7/00* (2006.01)
(Continued)

(52) U.S. Cl.
CPC ............. *B32B 3/30* (2013.01); *B29C 33/424* (2013.01); *B29C 59/02* (2013.01); *B81C 1/0046* (2013.01); *B81C 1/00206* (2013.01); *G03F 7/0002* (2013.01); *B29C 33/3842* (2013.01); *B82Y 40/00* (2013.01); *Y10T 428/24479* (2015.01)

(58) Field of Classification Search
CPC ......... B32B 3/30; B32B 33/42; B29C 59/02; B29C 33/3878; B29C 33/424; B81C 1/00206; B81C 1/0046; B82Y 40/00
See application file for complete search history.

(56) References Cited

U.S. PATENT DOCUMENTS

2005/0064054 A1*   3/2005   Kasumi .................. B82Y 10/00
                                                                                                   425/112
2007/0062396 A1*   3/2007   Takai ...................... B29C 33/50
                                                                                                   101/406

(Continued)

FOREIGN PATENT DOCUMENTS

WO     2012048870 A2    4/2012
WO     2012087352 A2    6/2012

OTHER PUBLICATIONS

Nanoimprint Lithography—Wikipedia.*
(Continued)

*Primary Examiner* — Alison L Hindenlang
*Assistant Examiner* — Jerzi H Moreno Hernandez
(74) *Attorney, Agent, or Firm* — Sam Pasternack; MIT Technology Licensing Office

(57) ABSTRACT

Inverted Nanocone Structures and Its Fabrication Process. The method of fabricating nanotextured structures includes making a master mold having an array of tapered structures to be replicated. The master mold is pressed into a curable polymer supported on a substrate and the polymer is cured. Thereafter, the mold is detached from the cured polymer to form the nanotextured structure.

11 Claims, 4 Drawing Sheets

(51) Int. Cl.
B81C 1/00 (2006.01)
B29C 33/38 (2006.01)
B82Y 40/00 (2011.01)

(56) References Cited

U.S. PATENT DOCUMENTS

| | | | |
|---|---|---|---|
| 2009/0026658 A1* | 1/2009 | Hosoda | B29C 59/022 264/319 |
| 2010/0089443 A1 | 4/2010 | Bloomstein et al. | |
| 2012/0010599 A1 | 1/2012 | Jin et al. | |
| 2013/0189485 A1* | 7/2013 | Gupta et al. | 428/141 |
| 2013/0284690 A1* | 10/2013 | Morhard et al. | 216/11 |
| 2014/0011013 A1* | 1/2014 | Jin et al. | 428/297.4 |
| 2014/0210134 A1* | 7/2014 | Wakamatsu | B29C 59/02 264/293 |

OTHER PUBLICATIONS

Tuteja et al., "Designing superoleophobic surfaces.", 2007, Science, 318.5856: 1618-1622.*
Itoh, "Simple nanoimprint lithography with 50 nm resolution using vacuum packing", Key Engineering Materials, 2010, vol. 459, p. 111-115.*
Y.F. Huang et al., Improved broadband and quasiomnidirectional anti-reflection properties with biomimetic silicon nanostructures. Nature Nanotechnology, 2007, 770-774, 2, USA.
C. T. Wu et al., Design of Artifical Hollow Moth-Eye Structures Using Anodic Nanocones for High-Performance Optics, Chemistry of Materials, 2010, 6583-6589, 22, USA.
C. Su et al., Fabrication of an optially transparent super-hydrophobic surface via embedding nano-silica, Applied Surface Science, 2006, 2633-2636, 253, USA.
K. Choi et al., Nano-tailoring the Surface Structure for the Monolithic High-Performance Antireflection Polymer Film, Advanced Materials, 2010, 3713-3718, 22, USA.
X. Gao et al., The Dry-Style Antifogging Properties of Mosquito Compound Eyes and Artficial Analogues Prepared by Soft Lithography, Advanced Materials, 2007, 2213-2217, 19, USA.
E. Martines et al., Superhydrophobicity and Superhydrophilicity of Regular Nanopatterns, Nano Letters, 2005, 2097-2103, 5, USA.
K.C. Park et al., Nanotextured Silica Surfaces with Robust Superhydrophobicity and Omnidirectional Broadband Supertransmissivity, ACS Nano, 2012, 3789-3799, 6, USA.
Deng et al., Candly Soot as a Template for a Transparent Robust Superamphiphobic Coating, Science, 2012, 67-70, 335, USA.

Notification Concerning Transmittal of International Preliminary Report on Patentability for PCT/US2013/049677 mailed on Jan. 22, 2015.
Y.F. Huang, et al., Improved Broadband and Quasi-Omindirectional Anti-Reflection Properites with Biomimetic Silicon Nanostructures, Nature Nanotechnology, 2007, 770-774, 2, USA.
Chia-Tien Wu et al., Design of Hollow Moth-Eye Structures Using Anodic Nanocones for High-Performance Optics, Chemistry of Materials, 2010, 6583-6589, 22, USA.
Changhong Su, et al., Fabrication of an Optically Transparent Super-Hydrophobic Surface via Embedding Nano-Silica, Applied Surface Science, 2006, 2633-2636, 253, USA.
Kiwoon Choi, et al., Nano-tailoring the Surface Structure for the Monolithic High-Performance Antireflection Polymer Film, Advanced Materials, 2010, 3713-3718, 22, USA.
Xuefeng Gao, et al., The Dry-Style Antilogging Properties of Mosquito Compound Eyes and Artifical Analogues Prepared by Soft Lithography, Advanced Materials, 2007, 2213-2217, 19, USA.
Elena Martines, et al., Superhydrophobocity and Superhydrophobocity of Regular Nanopatters, Nano Letters, 2005, 2097-2103, 5, USA.
Kyoo-Chul Park, et al., Nanotextured Silica Surfaces with Robust Superhydrophobicity and Omnidirectional Broadband Supertransmissivity, ACS Nano, 2012, 3789-3799, 6, USA.
Xu Deng, et al., Candel Soot as a Template for a Transparent Robust Superamphiphobic Coating, Science, 2012, 67-70, 335, USA.
International Search Report PCT/US2013/049677 mailed on Oct. 12, 2013.
Takashi Yanagishita, et al., Antireflections Polymer Hole Array Structures by Imprinting Using Metal Molds from Anodic Porous Alumina, Applied Physics Express, May 23, 2008, p. 067004, vol. 1, US.
Kiwoon Choi, et al., Nano-tailoring the Surface Structure for the Monolithic High-Performance Antireflection Polymer Film, Advanced Materials, Jul. 12, 2010, pp. 3713-3718, vol. 22-No. 33, US.
Butt Haider, et al., Enhanced reflection from arrays of silicon based inverted nanocones, Applied Physics Letters, Sep. 26, 2011, pp. 133105-1-133105-2, vol. 99-No. 13, US.
Kyoo-Chul Park, et al., Nanotextured Silica Surfaces with Robust Superhydrophobicity and Omnidirectional Broadband Supertransmissivity, ACS Nano, May 22, 2012, pp. 3789-3799, vol. 6-No. 5, US.
Takashi Yanagishita, et al., Antireflections Polymer Surface Using Anodic Porous Alumina Molds with Tapered Holes, Chemistry Letters, Mar. 10, 2007, pp. 530-531, vol. 36-No. 4. US.
Elena Martines, et al., Superhydrophobicity and Superhydrophilicity of Regular Nanopatterns, Nano Letters, Oct. 12, 2005, pp. 2097-2103, vol. 5-No. 10, American Chemical Society, US.

* cited by examiner

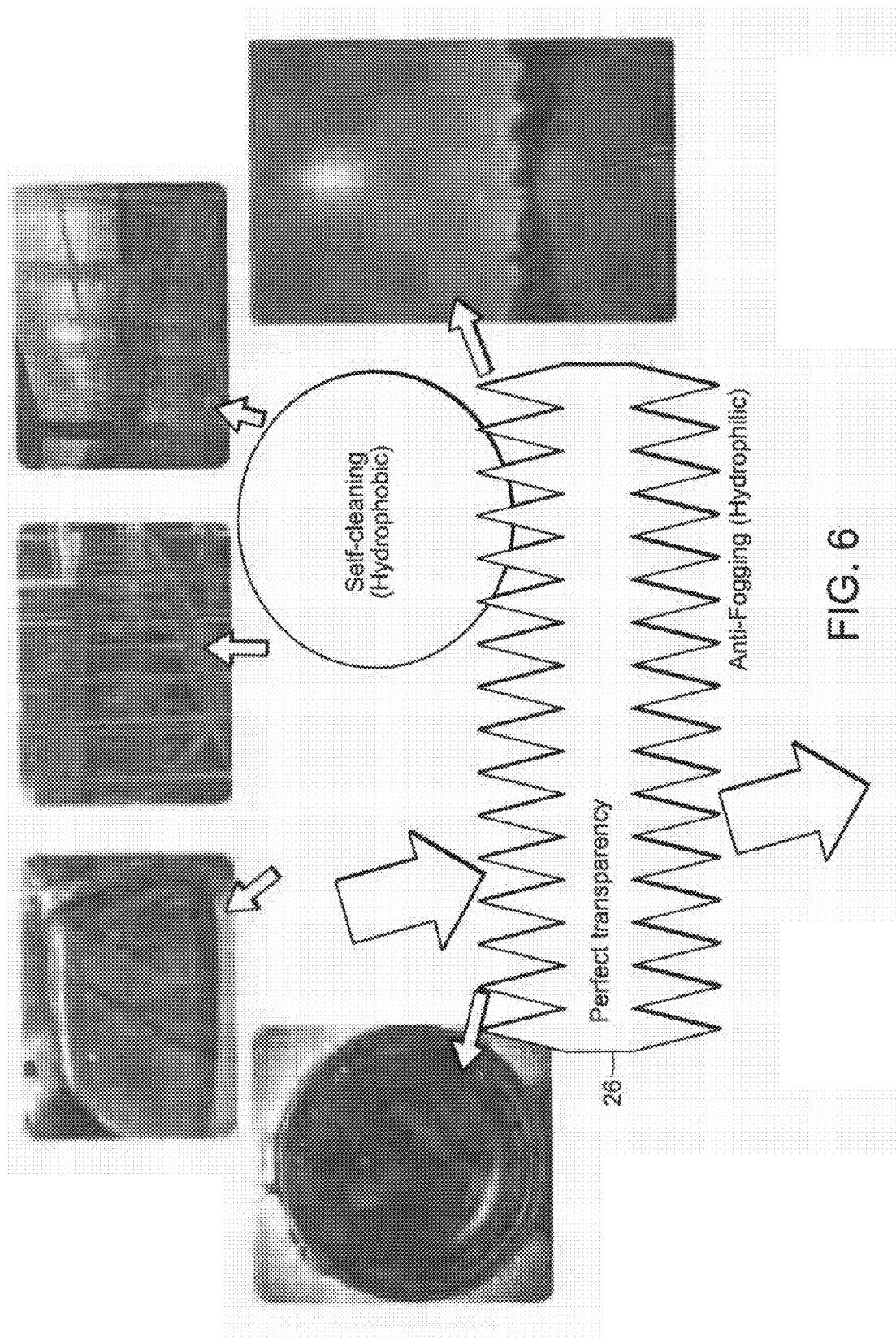

20

INVERTED NANOCONE STRUCTURES FOR MULTIFUNCTIONAL SURFACE AND ITS FABRICATION PROCESS

This application claims priority to provisional application Ser. No. 61/669,240, filed on Jul. 9, 2012, the contests of which are incorporated herein by reference in their entirety.

BACKGROUND OF THE INVENTION

This invention relates to nanostructure arrays for multifunctional surfaces that are mechanically robust and provide superior optical and wetting properties such as antireflection and superhydrophobicity/hydrophilicity. The invention also relates to the fabrication process for the nanostructure arrays.

Nanostructured surfaces have been widely studies for their superior optical and wetting properties such as antireflection and superhydrophobicity/hydrophilicity [1, 2, 3]. Due to subwavelength feature size, nanostructured surfaces behave as an effective medium with gradually varying index of refraction. Such a surface can be used to suppress Fresnel reflection at material interfaces, thereby acting as an anti-reflection surface and allowing broadband light to pass through without reflection loses [4]. In addition, both hierarchical roughness of these structures and an intrinsic chemical property of the surfaces can induce artificial superhydrophobicity or superhydrophilicity, which can be applied as self-cleaning or anti-fogging surfaces, respectively [5, 6].

Recently, high aspect ratio (approximately 5) silica nanocone structures, demonstrating structural superhydrophilicity or, in combination with a suitable chemical coating, robust superhydrophobicity, and enhanced transmissivity, have been successfully fabricated directly on a fused silica substrate with few defects and a large pattern area [7]. By using interference lithography and multiple shrinking mask etching, the desired aspect ratio nanocone structures were created for optimizing the multifunctionality of the textured surface [8]. Although the prior art structures provided notable performance, the mechanical stability and properties of these prior art structures are not suitable to sustain mechanical impact (including finger touch) because of the high aspect ratio and isolated nature of the structures.

It is an object of the present invention to provide an alternative type of nanostructure for multifunctional surfaces (anti-reflectivity, superhydrophobicity, superhydrophilicity and superoleophobicity) with high mechanical strength and high optical and wetting performance compared to existing nanostructures [7]. Another object of the invention is a fabrication process for the structures disclosed herein that is simple, and cost effective for manufacturing the multifunctional surfaces.

SUMMARY OF THE INVENTION

In a first aspect, the invention is method of fabricating nanotextured structures, including making a master mold having an array of tapered structures to be replicated. The master mold is pressed into a curable polymer supported on a substrate and the polymer is cured. Thereafter, the mold is detached from the cured polymer to form the nanotextured structure. In a preferred embodiment, the master mold is fabricated using lithography and etching. The master mold may be made of silicon or fused silica glass. The curable polymer may be heat curable or photo curable. It is preferred that an anti-adhesion layer be deposited on the master mold to prevent sticking. It is also preferred that the pressing step utilize vacuum assisted wetting.

The master mold may be fabricated with positive resist or negative resist. The profile, height and period of the tapered structures to be replicated are selected to control surface characteristics. In yet another embodiment, re-entrant textured surfaces are formed on the replicated, nanotextured structure. The re-entrant textured surfaces may be made by pressing a hot plate into the replicated structure, or by pressing a rotating plate into the replicated structure. Conditions are optimized for perfect re-entrant structures.

In another aspect, the invention is a nanotextured surface structure comprising periodic tapered nanohole or inverted nanocone arrays. The surface may exhibit superhydrophilicity and when the surface includes a selected coating, the structure exhibits hydrophobicity. The surfaces of the invention may exhibit enhanced optical transmission and low reflectance.

BRIEF DESCRIPTION OF THE DRAWING

FIG. 6 is a schematic illustration of a window fabricated with the process according to an embodiment of the invention.

DESCRIPTION OF THE PREFERRED EMBODIMENT

Figure 1:
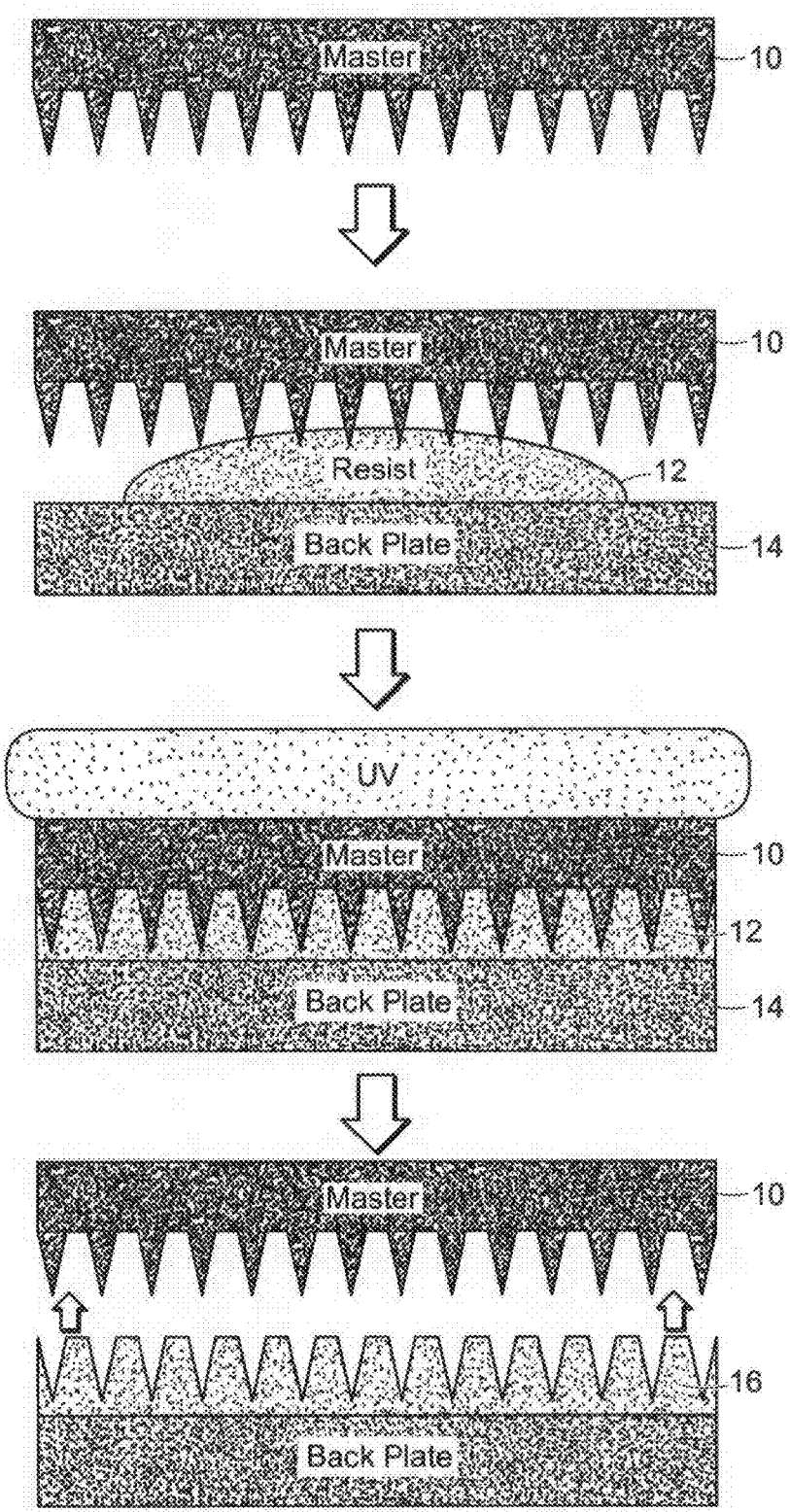
FIG. 1 is a schematic illustration of the process disclosed herein according to an embodiment of the invention.
Figure 2:
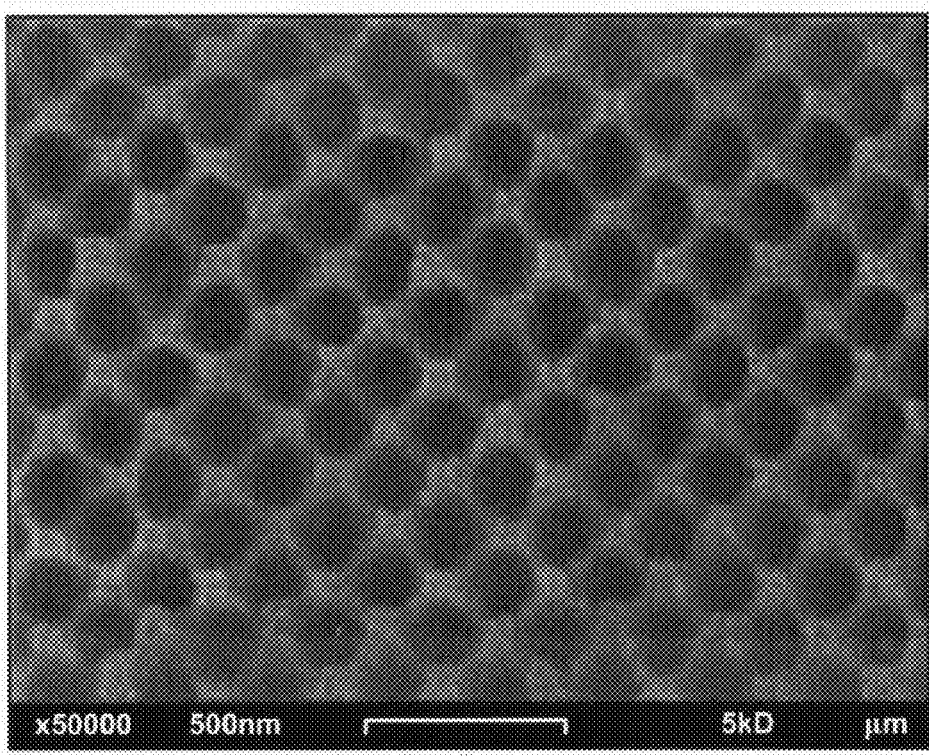
FIG. 2 is a scanning electron micrograph of an array of replicated inverted nanocone structures.

The nanostructures disclosed herein are fabricated using a novel and advanced replication technology. With reference first to FIG. 1, a master mold 10 is fabricated using any lithography technique and subsequent etching steps with any material, such as silicon or fused silica glass. Thereafter, the master mold is used to fabricate inverted nanocone arrays. The master mold 10 contents and is pressurized onto resist 12 that may be a heat or photo curable polymer on a glass substrate 14. After curing the polymer resist 12 either with heat or ultraviolet (UV) light, the master mold 10 is detached from the replicated polymer surface 16. Thus, nanocone arrays on the master mold 10 are inversely replicated into the polymer 12, thus the surface is textured with nanohole arrays 18 as shown in FIG. 2. During the imprint process, it is preferred that an anti-adhesion layer be coated on the master mold 10 surface to prevent sticking problems. Further, in order to have a perfect pattern transfer, and without any bubbles in the polymer, vacuum assisted wetting is used when the nanocone arrays are pressed into the liquid polymer 12, which is also one of the important processes in this invention.

Figure 3:
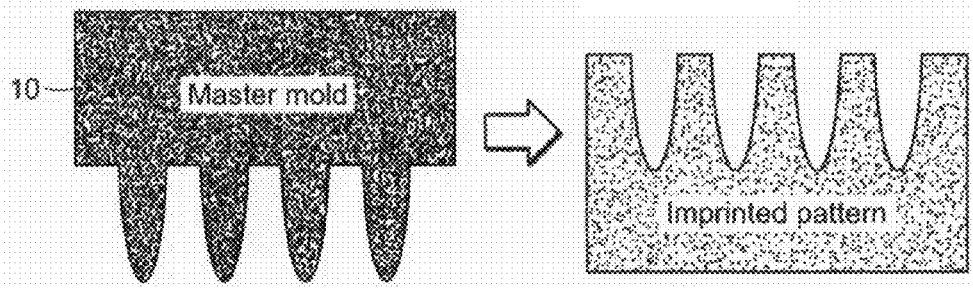
FIG. 3 is a schematic illustration of imprinted inverted concave nanocone structures with a master mold fabricated with positive resist.
Figure 4:
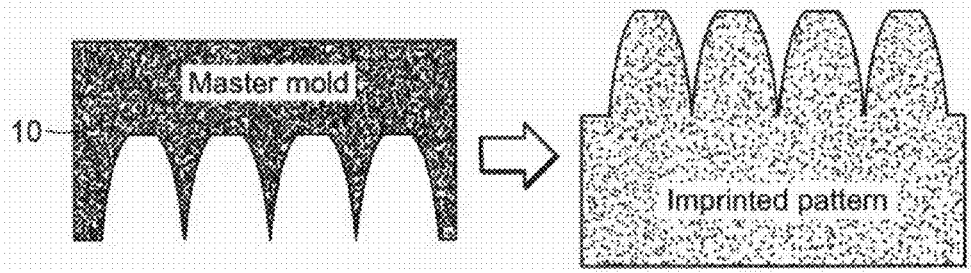
FIG. 4 is a schematic illustration of imprinted inverted convex nanocone structures with a master mold fabricated with negative resist.

Depending on the geometry of the master mold 10, different inverted nanocone structures (or nanohole structures) can be fabricated. FIG. 3 shows a schematic illustration of an imprinted inverted concave nanocone structure with a master mold 10 fabricated with positive resist. When the mold is fabricated with positive resist [7], the convex nanocone structures are realized for the master mold. FIG. 4 shows imprinted inverted convex nanocone structures with the master mold 10 fabricated with negative resist. The profile, height and period of the imprinted pattern can be easily controlled, optimized for superhydrophobicity, superhydrophilicity, anti-reflectivity and mechanical robustness. For example, the structures in FIG. 3 tend to be mechanically more robust than those in FIG. 4, but those in FIG. 4 may have better transparency and superhydrophobicity.

Deng et al. recently fabricated transparent and superoleophobic surfaces. However, the surfaces consisting of accidental nanoparticles limited special-phase coherence, resulting in non-perfect periodic/quasi random structures that scatter light and make themselves a lot less transparent than glass [9].

Figure 5:
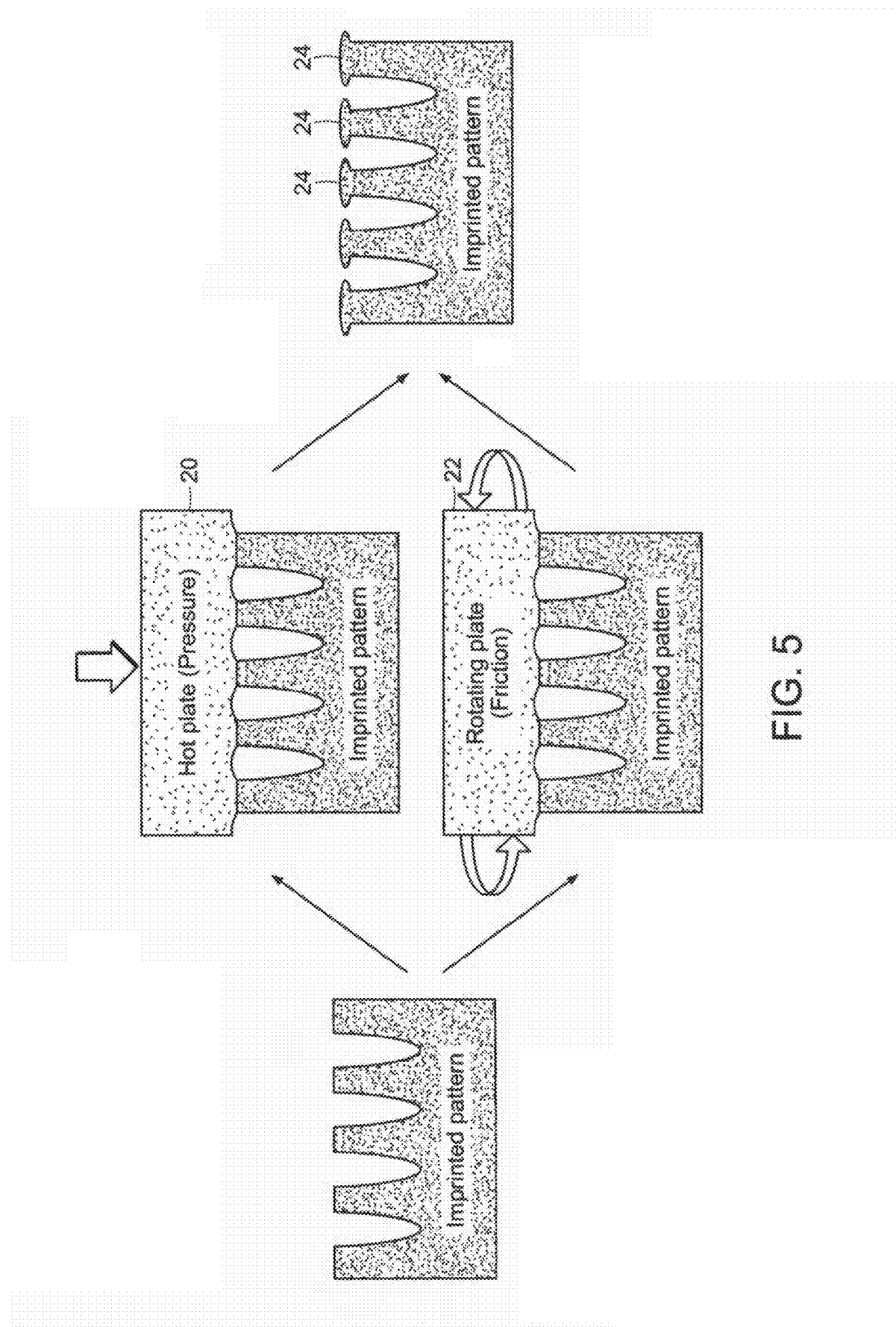
FIG. 5 is a schematic illustration of the process of making re-entrant nanostructures for transparent superoleophobic surfaces.

We also disclose novel and simple fabrication methods for surfaces with enhanced transparency and oil-repellency or superoleophobicity (for anti-fingerprint surfaces) by creating re-entrant textured surfaces as shown in FIG. 5. First, an imprinted surface with inverted nanocone arrays is fabricated as discussed above. The imprinted pattern is contact or pressurized by a hot plate 20 and the re-entrant structures are created by local reflow of the material of the imprinted pattern itself. An alternate embodiment is that the imprinted pattern is contacted and pressurized by a rotating plate 22 thereby creating the re-entrant structures 24 shown in FIG. 5. Temperature and pressure of the hot plate, and pressure, friction and speed of the rotating plate can be optimized for perfect re-entrant structures.

The aspect ratio and shape of the nanohole structures disclosed herein can be optimized to achieve better wetting or optical functions using the fabrication method disclosed herein. By texturing subwavelength nanoholes on both sides of glass and modifying their surface energies, it is possible to combine high-pressure robustness of superhydrophobicity and near-perfect transparency (or anti-reflection property). In addition to the synergetic effect, the nanohole surface can show a macroscopic anti-fogging function for practical applications, including transparent windshields and goggles that are self-cleaning outside. FIG. 6 shows potential applications of glass treated on both sides. This window 26 with the nanohole or inverted nanocone structure will enhance transmission, and at the same time, make the surfaces both superhydrophobic and superhydrophilic such as self-cleaning (outside) and anti-fogging (inside) glass. In addition, transparent anti-fingerprint and scratch resistant surfaces can be fabricated with these structures.

The disclosed fabrication process, according to the invention, can also be used to produce a protective glass for digital cameras. In this case, nearly 100% of the incident light with a wide angle can be collected without any loss, so that pictures with better quality can be taken, even at night. Using such high transmission protective glass will also eliminate interference effects. Dust or contamination on the surface can be easily removed with water due to the superhydrophobic surface. Those of ordinary skill in the art will recognize that the application is not merely for digital cameras, but also for solar cells, because the efficiency of a solar cell is highly influenced by dust contamination and Fresnel reflection losses. In humid conditions, the technology disclosed herein can be used for anti-fogging glass and good images may be taken without any bubbles on the lens.

The nanohole or inverted nanocone structures disclosed herein have stronger mechanical properties than tapered nanocone structures known in the prior art since nanohole structures are expected to withstand larger external forces, since they are now connected to each other and support each other in a two-dimensional network. Surfaces according to the invention with these nanohole structure also become scratch resistant. Once use would be as a scratch resistant surface for touch screen electronic devices. Anti-fingerprint surfaces can be realized by superoleophobicity resulting from its geometry combined with proper chemical coating on the nanohole structures with re-entrant textured surfaces in FIG. 5.

The fabrication method disclosed herein is compatible and can be adapted to all conventional 2D lithography techniques. The mold 10 with nanocone structures can be fabricated with any lithographic process. Moreover, self-assembly approaches such as colloidal lithography or block copolymer can be used to pattern the nanocone structures.

The present invention creates nanohole or inverted nanocone structures with a tapered profile at the same time. These tapered nanohole or inverted nanocone structures with re-entrant geometry on the tips are suitable for enhancing transmission (anti-reflectivity) and wetting properties (superhydrophobicity, superhydrophilicity, and superoleophobicity).

The multifunctional nanotextured surfaces disclosed herein consist of perfect periodic tapered nanohole arrays or inverted nanocone arrays. The mechanical robustness of the structures disclosed herein is higher than for conventional moth eye-like structures, arrays of isolated tapered nanostructures. In the present invention, the inverted nanocone structures are structurally supported by adjacent nanostructures, as was shown in conjunction with FIG. 2. For applications such as touch screen panels or car windows, the proposed multifunctional nanotextured surfaces which have high mechanical robustness are more desirable in terms of durability and stability, since the nanostructures will be exposed to a lot of mechanical impacts.

The multifunctionality of the surfaces disclosed herein can be used for a wide range of applications, including self-cleaning and omnidirectional optical elements, as well as anti-fogging optical lenses for microscopes in humid biological environments, and semiconductor lithography equipment.

The numbers in square brackets refer to the references listed herein.

It is recognized that modifications and variations of the present invention will occur to those of ordinary skill in the art, and it is intended that all such modifications and variations be included within the scope of the appended claims.

REFERENCES

[1] Y. F. Huang, et al. *Nature Nanotechnology*, 2, pp. 770-774, (2007)
[2] C.-T. Wu et al., *Chemistry of Materials*, 22, pp. 6583-6589, (2010)
[3] C. Suet et al., *Applied Surface Science*, 253, pp. 2633-2636, (2006)
[4] K. Choi et al., *Advanced Materials*, 22, pp. 3713-3718, (2010)
[5] X. Gao et al., *Advanced Materials* 19, pp. 2213-2217, (2007)
[6] E. Martines et al., *Nano Letters*, 5, pp. 2097-2103, (2005)
[7] K. C. Park et al., *ACS Nano*, 6, pp. 3789-3799 (2012)
[8] H. J. Choi et al., U.S. patent application Ser. No. 61/477,792, April 2011 (MIT Case No. 14861)
[9] Deng et al., *Science*, 335, pp. 67-70 (2012)

What is claimed is:

1. Method of fabricating nanotextured structures comprising:
   - making a roaster mold having an array of tapered structures to be replicated;
   - pressing the master mold, utilizing vacuum assisted wetting, into a curable polymer supported on a substrate;
   - curing the polymer; and
   - detaching the mold from the cured polymer to form the nanotextured structure further including forming re-entrant textured surfaces on the nanotextured structure by pressing a rotating plate into the nanotextured structure.

2. The method of claim 1 wherein the master mold is fabricated using lithography and etching.

3. The method of claim 1 wherein the master mold is made of silicon or fused silica glass.

4. The method of claim 1 wherein the curable polymer is heat curable.

5. The method of claim 1 wherein the curable polymer is photo curable.

6. The method of claim 1 wherein the substrate is glass.

7. The method of claim 1 further including coating an anti-adhesion layer on the master mold to prevent sticking.

8. The method of claim 1 wherein the master mold is fabricated with positive resist.

9. The method of claim 1 wherein the master mold is fabricated with negative resist.

10. The method of claim 1 further including selecting profile, height and period of the tapered structures to be replicated to control surface properties.

11. The method of claim 10 wherein the surface properties include superhydrophilicity, superhydrophobicity, anti-reflectivity and mechanical robustness.

* * * * *